(12) United States Patent
Liu et al.

(10) Patent No.: US 6,828,186 B2
(45) Date of Patent: Dec. 7, 2004

(54) VERTICAL SIDEWALL PROFILE SPACER LAYER AND METHOD FOR FABRICATION THEREOF

(75) Inventors: Shih-Chiang Liu, Kaohsiung (TW); Chi-Hsin Lo, Hsin-Chu (TW); Chia-Shiang Tsai, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/401,714

(22) Filed: Mar. 27, 2003

(65) Prior Publication Data

US 2004/0188779 A1 Sep. 30, 2004

(51) Int. Cl.⁷ .......................................... H01L 21/8232
(52) U.S. Cl. ...................... 438/230; 438/595; 438/696; 438/703; 438/713; 438/778
(58) Field of Search ................... 438/230, 585, 438/595, 696, 703, 713, 761, 778, FOR 182, FOR 388, FOR 403

(56) References Cited

U.S. PATENT DOCUMENTS

| | | | | |
|---|---|---|---|---|
| 5,736,446 A | * | 4/1998 | Wu | 438/305 |
| 5,760,435 A | * | 6/1998 | Pan | 257/314 |
| 5,786,256 A | * | 7/1998 | Gardner et al. | 438/305 |
| 6,121,138 A | | 9/2000 | Wieczorek et al. | |
| 6,207,532 B1 | * | 3/2001 | Lin et al. | 438/424 |
| 2003/0211697 A1 | * | 11/2003 | Hsu et al. | 438/305 |

* cited by examiner

*Primary Examiner*—George Fourson
*Assistant Examiner*—Joannie Adelle Garcia
(74) *Attorney, Agent, or Firm*—Tung & Associates

(57) ABSTRACT

A method for forming a spacer layer adjoining a substantially vertical first sidewall of a topographic feature within a microelectronic product employs an anisotropic etching of a reentrant spacer material layer formed upon the topographic feature. The spacer layer is formed at least in part with a substantially vertical second sidewall laterally separated from the substantially vertical first sidewall. The method is useful for forming spacer layers within field effect transistor devices.

14 Claims, 1 Drawing Sheet

VERTICAL SIDEWALL PROFILE SPACER LAYER AND METHOD FOR FABRICATION THEREOF

BACKGROUND OF THE INVENTION

1. Field of the Invention

The present invention relates generally to spacer layers formed within microelectronic products. More particularly, the present invention relates to vertical sidewall profile spacer layers formed within microelectronic products.

2. Description of the Related Art

The use of spacer layers is common in the microelectronic product fabrication art for spacing microelectronic structures within microelectronic products. A particularly common use of a spacer layer is for spacing a gate electrode from a heavily doped portion of a source/drain region within a field effect transistor (FET) device employed within a semiconductor product.

Spacer. layers are desirable and often essential in the microelectronic product fabrication art. However, spacer layers are nonetheless not entirely without problems.

In that regard, spacer layers are often difficult to form with enhanced spacer layer profiles. For example, substantially vertical spacer layer sidewall profiles are often desirable since they generally provide a more precise spacing of separated structures within microelectronic products.

It is thus desirable to form spacer layers with enhanced profiles.

It is towards the foregoing object that the present invention is directed.

Various spacer layers having desirable properties, and methods for fabrication thereof, have been disclosed in the microelectronic product fabrication art.

Included but not limiting are spacer layers and methods disclosed within Wieczorek et al., in U.S. Pat. No. 6,121,138 (a silicon nitride spacer layer having a substantially vertical sidewall profile such as to attenuate salicide bridging between a gate electrode and source/drain region separated by the spacer layer within a FET device).

The teachings of the foregoing reference are incorporated herein fully by reference.

Desirable for use within microelectronic products are additional spacer layers with enhanced profiles, and methods for fabrication thereof.

It is towards the foregoing object that the present invention is directed.

SUMMARY OF THE INVENTION

A first object of the invention is to provide a spacer layer for use within a microelectronic product, and a method for fabrication thereof.

A second object of the invention is to provide a spacer layer and method in accord with the first object of the invention, wherein the spacer layer is formed with enhanced profile.

In accord with the foregoing objects, the present invention provides: (1) a method for fabricating a spacer layer within a microelectronic product; and (2) a microelectronic product having formed therein a spacer layer.

The method first provides a substrate having formed thereover a topographic feature having a substantially vertical first sidewall. The method next provides for forming over the substrate, including the topographic feature, a blanket spacer material layer having a reentrant sidewall profile with respect to the substantially vertical first sidewall. Finally, the method provides for anisotropically etching the blanket spacer material layer to form a spacer layer adjoining the substantially vertical first sidewall of the topographic feature. Within the method, the spacer layer has a second sidewall at least in part substantially vertical and laterally separated from the substantially vertical first sidewall of the topographic feature.

The method of the invention contemplates the microelectronic product having formed therein the spacer-layer in accord with the method of the invention.

Within the invention, the blanket spacer material layer having the reentrant sidewall profile with respect to the topographic feature may be formed as a laminate of a blanket conformal first spacer material layer and a blanket reentrant second spacer material layer.

The invention provides a spacer layer for use within a microelectronic product, and a method for fabrication thereof, wherein the spacer layer is formed with enhanced profile.

The present invention realizes the foregoing object by employing a blanket spacer material layer having a reentrant sidewall profile with respect to a topographic feature having a substantially vertical first sidewall profile. Upon anisotropic etching, the blanket spacer material layer yields a spacer layer having at least in part a substantially vertical second sidewall profile laterally separated from the substantially vertical first sidewall profile.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a spacer layer for use within a microelectronic product, and a method for fabrication thereof, wherein the spacer layer is formed with enhanced profile.

The present invention realizes the foregoing objects by employing a blanket spacer material layer having a reentrant sidewall profile with respect to a topographic feature having a substantially vertical first sidewall profile. Upon anisotropic etching, the blanket spacer material layer yields a spacer layer having at least in part a substantially vertical second sidewall profile laterally separated from the substantially vertical first sidewall profile.

The present invention provides particular value within the context of forming dielectric spacer layers separating gate electrodes and source/drain regions within FET devices within semiconductor products. However, the invention is not intended to be so limited. Rather, the present invention may be employed for forming spacer layers formed of materials including but not limited to conductor materials, semiconductor materials and dielectric materials. The spacer layers may be formed within microelectronic products including but not limited to integrated circuit products (including semiconductor products), ceramic substrate products and optoelectronic products.

Figure 1:
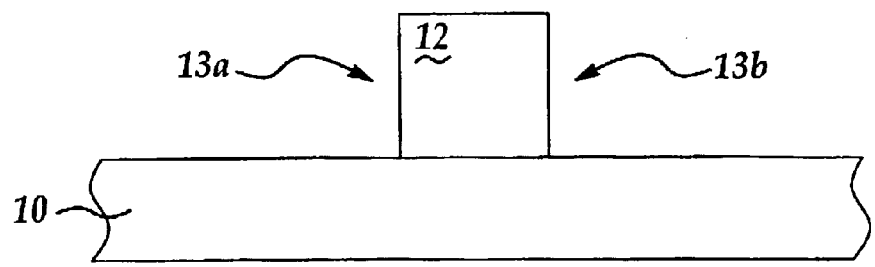
FIG. 1, FIG. 2 and FIG. 3 show a series of schematic cross-sectional diagrams illustrating the results of progressive stages of fabricating a microelectronic product having formed therein a spacer layer in accord with the present invention.
Figure 2:
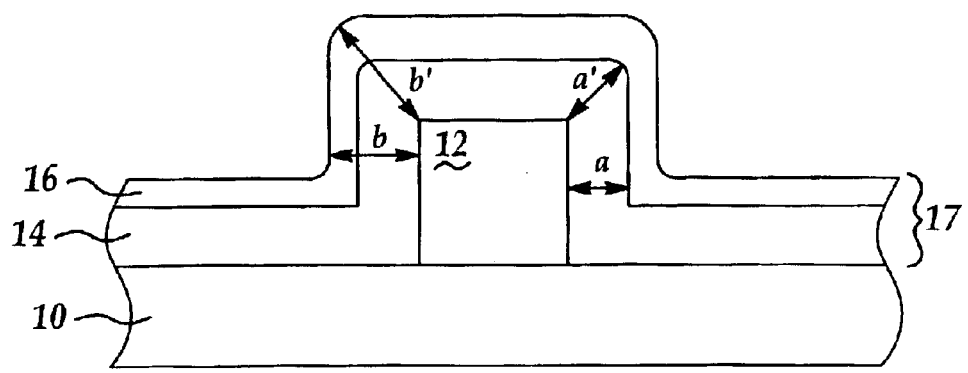
Figure 3:
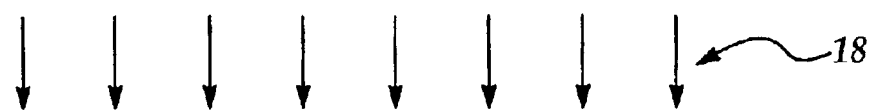

FIG. 1 to FIG. 3 show a series of schematic cross-sectional diagrams illustrating the results of progressive stages of fabricating a microelectronic product in accord with the preferred embodiment of the invention.

FIG. 1 shows a schematic cross-sectional diagram of the microelectronic product at an early stage in its fabrication in accord with the preferred embodiment of the invention.

FIG. 1 shows a substrate 10 having formed thereover a topographic feature 12 which comprises a pair of first sidewalls 13a and 13b each of which is substantially vertical. Within the context of the present invention, "substantially vertical" is intended to be within about 5 degrees of vertical with respect to the plane of the substrate 10 (i.e., from about 85 to about 95 degrees with respect to the plane of the substrate 10).

Within the invention, the substrate 10 may be employed within a microelectronic product selected from the group including but not limited to integrated circuit products (including semiconductor products), ceramic substrate products and optoelectronic products. Although not specifically illustrated within the schematic cross-sectional diagram of FIG. 1, the substrate 10 may consist of a substrate alone as employed within the microelectronic product. In the alternative, the substrate 10 may comprise a substrate having formed thereupon and/or thereover additional microelectronic layers as are conventional. Such additional microelectronic layers may be formed of microelectronic materials selected from the group including but not limited to conductor materials, semiconductor materials and dielectric materials.

Most typically, the substrate 10 comprises a silicon semiconductor substrate employed within a semiconductor product.

Within the invention, the topographic feature 12 may be formed of materials including but not limited to conductor materials, semiconductor materials, dielectric materials and composites thereof. When the substrate 10 consists of a silicon semiconductor substrate, the topographic feature 12 is typically a gate electrode stack comprising a gate dielectric layer having a gate electrode formed thereupon. The gate electrode stack is typically formed of a linewidth from about 0.13 to about 0.25 microns and a thickness of from about 1500 to about 3500 angstroms.

FIG. 2 shows the results of further processing of the microelectronic product of FIG. 1.

FIG. 2 shows a blanket conformal first spacer material layer 14 (i.e., a single thickness layer) formed upon exposed portions of the substrate 10 and the topographic feature 12. In turn, FIG. 2 also shows a blanket reentrant second spacer material layer 16 (i.e., a variable thickness layer) formed upon the blanket conformal first spacer material layer 14. Within the invention, the blanket conformal first spacer material layer 12 and the blanket reentrant second spacer material layer 16 in an aggregate form a blanket reentrant composite spacer material layer 17.

While the preferred embodiment illustrates the invention within the context of the blanket conformal first spacer material layer 14 having formed thereupon the blanket reentrant second spacer material layer 16 to form the blanket reentrant composite spacer material layer 17, a single blanket reentrant spacer material layer of appropriate reentrant dimensions is also operational within the context of the invention. Further, a microelectronic product comprising additional laminated blanket conformal spacer material layers and blanket reentrant spacer material layers is also within the context of the invention, assuming appropriate reentrant properties.

To better define operative features of the invention, FIG. 2 illustrates a sidewall thickness "a" and an edge thickness "a'" of the blanket conformal first spacer material layer 14. Typically an edge thickness "a'" to sidewall thickness "a" ratio is from about 1.25 to about 1.30 for blanket conformal layers as are conventionally deposited. Similarly, FIG. 2 also illustrates a sidewall thickness "b" and an edge thickness "b'" for the blanket reentrant composite spacer material layer 17. Typically, the edge thickness "b'" to sidewall thickness "b" ratio (which may be employed as a measure of reentrant character) is from about 1.35 to about 1.40.

Within the invention, each of the blanket conformal first spacer material layer 14 and blanket reentrant second spacer material layer 16 may independently be formed of spacer materials selected from the group including but not limited to conductor materials, semiconductor materials and dielectric materials. When formed of dielectric materials, each of the blanket conformal first spacer material layer 14 and the blanket reentrant second spacer material layer 16 is formed at least in part of (and preferably consisting of) a silicon oxide spacer material, and preferably not a silicon nitride material.

When formed of a silicon oxide dielectric material, the blanket conformal first spacer material layer 14 is formed employing a low pressure chemical vapor deposition (LPCVD) method. The blanket conformal first spacer material layer 14 is formed of a single thickness from about 1600 to about 1700 angstroms.

When formed of a silicon oxide dielectric material, the blanket reentrant second spacer material layer 16 is formed employing a plasma enhanced chemical vapor deposition (PECVD) method employing silane as a silicon source material and nitrous oxide (i.e., N2O) as an oxidant source material. Typically, the PECVD method also employs: (1) a reactor chamber pressure of from about 3.0 to about 3.6 torr; (2) a source radio frequency power of from about 135 to about 165 watts, absent a bias power; (3) a substrate temperature of from about 380 to about 420 degrees centigrade; (4) a silane (in nitrogen) flow rate of from about 32 to about 38 standard cubic centimeters per minute (sccm); and (5) a nitrous oxide flow rate of from about 324 to about 396 sccm. Typically, the blanket reentrant second spacer material layer 16 is formed to a variable thickness of from about 450 to about 550 angstroms.

FIG. 3 shows the results of further processing of the microelectronic product of FIG. 2.

FIG. 3 shows the results of etching the blanket reentrant second spacer material layer 16 and the blanket conformal first spacer material layer 14 with an etching plasma 18 to form a pair of spacer layers 14a and 14b adjoining the pair of first sidewalls 13a and 13b of the topographic feature 12.

The pair of spacer layers 14a and 14b is formed as a pair of truncated rectangles and not of an "L" shape. In addition, the pair of spacer layers 14a and 14b is formed with a pair of second sidewalls 15a and 15b laterally separated from the pair of first sidewalls 13a and 13b. The pair of second sidewalls 15a and 15b is formed at least in part with a substantially vertical sidewall profile (i.e. from about 85 to about 90 degrees to the horizontal plane of the substrate 10), incident to being formed from a blanket composite spacer material layer having a reentrant profile.

The etching plasma 18 typically employs a fluorine containing etchant gas composition under circumstances where the blanket conformal first spacer material layer 14 and the blanket reentrant spacer material layer 16 are formed of silicon oxide materials. Other etchant gas compositions may be employed for forming spacer layers of other materials.

Under circumstances where the substrate 10 is a semiconductor substrate and the topographic feature 12 is a gate electrode stack, the semiconductor substrate also has formed therein a pair of source/drain regions to provide an FET device generally in accord with the FET device disclosed within Wieczorek et al., as cited within the Description of the Related Art, the teachings of which is incorporated herein fully by reference.

The preferred embodiment is illustrative of the invention rather than limiting of the invention. Revisions and modification may be made to methods, materials, structures and dimensions employed for fabricating a microelectronic product in accord with the preferred embodiment of the invention while still providing a microelectronic fabrication in accord with the invention, further in accord with the accompanying claims.

What is claimed is:

1. A method for fabricating a spacer layer comprising:
   providing a substrate having formed thereover a topographic feature having a substantially vertical first sidewall;
   forming over the substrate including the topographic feature a blanket spacer material layer having a reentrant sidewall profile with respect to the substantially vertical first sidewall; and
   etching the blanket spacer material layer to form a spacer layer adjoining the substantially vertical first sidewall of the topographic feature, the spacer layer having a second sidewall at least in part substantially vertical and laterally separated from the substantially vertical first sidewall of the topographic feature.

2. The method of claim 1 wherein the blanket spacer material layer is anisotropically etched to form the spacer layer.

3. The method of claim 1 wherein the blanket spacer material layer has an edge thickness to sidewall thickness ratio of from about 1.35 to about 1.40.

4. The method of claim 1 wherein the substrate is employed within a microelectronic product selected from the group consisting of integrated circuit products, ceramic substrate products and optoelectronic microelectronic products.

5. The method of claim 1 wherein the topographic feature is formed from a material selected from the group consisting of conductor materials, semiconductor materials, dielectric materials and composites thereof.

6. The method of claim 1 wherein the blanket spacer material layer is formed as a laminate of:
   a blanket conformal spacer material sub-layer; and
   a blanket reentrant spacer material sub-layer.

7. The method of claim 6 wherein:
   the blanket conformal spacer material sub-layer is formed to a thickness of from about 1600 to about 1700 angstroms; and
   the blanket reentrant spacer material sub-layer is formed to a thickness of from about 450 to about 550 angstroms.

8. The method of claim 1 wherein the spacer layer is not formed in an "L" shape.

9. A method for fabricating a field effect transistor device comprising:
   providing a semiconductor substrate having formed thereover a gate electrode having a substantially vertical first sidewall;
   forming over the semiconductor substrate including the gate electrode a blanket spacer material layer having a reentrant sidewall profile with respect to the substantially vertical first sidewall; and
   etching the blanket spacer material layer to form a spacer layer adjoining the substantially vertical first sidewall of the gate electrode, the spacer layer having a second sidewall at least in part substantially vertical and laterally separated from the substantially vertical first sidewall of the gate electrode.

10. The method of claim 9 wherein the blanket spacer material layer is anisotropically etched to form the spacer layer.

11. The method of claim 9 wherein the blanket spacer material layer has an edge thickness to sidewall thickness ratio of from about 1.35 to about 1.40.

12. The method of claim 9 wherein the blanket spacer material layer is formed as a laminate of:
   a blanket conformal spacer material sub-layer; and
   a blanket reentrant spacer material sub-layer.

13. The method of claim 12 wherein:
   the blanket conformal spacer material sub-layer is formed to a thickness of from about 1600 to about 1700 angstroms; and
   the blanket reentrant spacer material sub-layer is formed to a thickness of from about 450 to about 550 angstroms.

14. The method of claim 9 wherein the spacer layer is not formed in an "L" shape.

* * * * *